United States Patent
Du et al.

(10) Patent No.: US 11,899,071 B2
(45) Date of Patent: Feb. 13, 2024

(54) METHOD AND APPARATUS FOR DETERMINING STATE OF CHARGE OF BATTERY, MANAGEMENT SYSTEM AND STORAGE MEDIUM

(71) Applicant: Contemporary Amperex Technology Co., Limited, Ningde (CN)

(72) Inventors: Mingshu Du, Ningde (CN); Shichao Li, Ningde (CN); Shenzhi Tang, Ningde (CN); Jian Ruan, Ningde (CN); Yanhua Lu, Ningde (CN); Wei Zhang, Ningde (CN)

(73) Assignee: Contemporary Amperex Technology Co., Limited, Ningde (CN)

( * ) Notice: Subject to any disclaimer, the term of this patent is extended or adjusted under 35 U.S.C. 154(b) by 515 days.

(21) Appl. No.: 17/053,151

(22) PCT Filed: Jun. 17, 2020

(86) PCT No.: PCT/CN2020/096438
§ 371 (c)(1),
(2) Date: Nov. 5, 2020

(87) PCT Pub. No.: WO2020/259355
PCT Pub. Date: Dec. 30, 2020

(65) Prior Publication Data
US 2023/0095453 A1  Mar. 30, 2023

(30) Foreign Application Priority Data

Jun. 24, 2019 (CN) .................. 201910548061.4

(51) Int. Cl.
*G01R 31/3842* (2019.01)
*G01R 31/367* (2019.01)
*G01R 19/165* (2006.01)

(52) U.S. Cl.
CPC ..... *G01R 31/3842* (2019.01); *G01R 19/1659* (2013.01); *G01R 31/367* (2019.01)

(58) Field of Classification Search
None
See application file for complete search history.

(56) References Cited

U.S. PATENT DOCUMENTS 6,388,447 B1    5/2002  Hall et al.
2002/0171429 A1 11/2002 Ochiai et al.
(Continued)

FOREIGN PATENT DOCUMENTS

CN    101371155 A    2/2009
CN    101946187 B    6/2013
(Continued)

OTHER PUBLICATIONS

International Search Report dated Sep. 23, 2020 in corresponding International application No. PCT/CN2020/096438; 5 pages.
(Continued)

*Primary Examiner* — Jas A Sanghera
(74) *Attorney, Agent, or Firm* — Kilpatrick Townsend & Stockton LLP (57) ABSTRACT

Provided is a method and an apparatus for determining a state of charge of a battery, a battery management system and a storage medium, and relates to the field of battery technologies, where the method includes: obtaining a current OCV value of a battery and cumulative continuous charging or discharging capacity information of the battery; obtaining SOC credible information based on the current OCV value and the cumulative continuous charging or discharging capacity information; obtaining a corrected SOC value corresponding to the current OCV value according to the SOC credible information. According to the present disclosure, accuracy of SOC correction could be
(Continued)

improved by determining the SOC credible information under the current OCV; for batteries, especially those with a hysteresis characteristic, accuracy of SOC estimation could be improved, an error of SOC estimation could be reduced and reliability of battery and experience of users could be improved.

14 Claims, 5 Drawing Sheets

(56) References Cited

U.S. PATENT DOCUMENTS

| | | | |
|---|---|---|---|
| 2012/0133332 | A1 | 5/2012 | Ogane et al. |
| 2013/0300425 | A1 | 11/2013 | Shiraishi et al. |
| 2016/0259012 | A1* | 9/2016 | Sejima ................ G01R 31/367 |
| 2019/0178952 | A1 | 6/2019 | Takahashi |

FOREIGN PATENT DOCUMENTS

| | | |
|---|---|---|
| CN | 104859454 A | 8/2015 |
| CN | 105190338 A | 12/2015 |
| CN | 104859454 B | 4/2017 |
| CN | 106597309 A | 4/2017 |
| CN | 106970327 A | 7/2017 |
| CN | 107315147 A | 11/2017 |
| CN | 105203963 B | 12/2017 |
| CN | 108802620 A | 11/2018 |
| CN | 108819731 A | 11/2018 |
| CN | 110988720 A | 4/2020 |
| JP | H08-083628 A | 3/1996 |
| JP | 2013-057537 A | 3/2013 |
| JP | 2013-083496 A | 5/2013 |
| JP | 2013-178202 A | 9/2013 |
| JP | 2014059206 A | 4/2014 |
| JP | 2014-160015 A | 9/2014 |
| JP | 2015-038437 A | 2/2015 |
| JP | 2015154639 A | 8/2015 |
| JP | 2017-032294 A | 2/2017 |
| JP | 6075242 B2 | 2/2017 |
| JP | 2017-125813 A | 7/2017 |
| JP | 2018136158 A | 8/2018 |
| JP | 2018194357 A | 12/2018 |
| JP | 2021-532336 A | 11/2021 |
| WO | 2014/045706 A1 | 3/2014 |
| WO | 2018/181620 A1 | 10/2018 |

OTHER PUBLICATIONS

Office Action and Search Report dated Sep. 18, 2020 n corresponding Chinese application No. 201910548061.4; 8 pages.
The Extended European Search Report dated Jun. 17, 2021, including the Supplementary European Search Report and the European Search Opinion, in connection with corresponding EP Application No. 20793546.1 (11pp.).
First office action received in the corresponding KR application 10-2021-7035933, dated Apr. 27, 2023.
Notification to Grant Patent Right received in the corresponding Chinese application 201910548061.4, dated Jan. 14, 2021.
Written Opinion received in the corresponding international application PCT/CN2020/096438, dated Sep. 23, 2020.
Written Decision on Registration received in the corresponding Korean application 10-2021-7035933, dated Aug. 29, 2023.
Decision to Grant a Patent received in the corresponding Japanese application 2021-558706, dated Oct. 3, 2022.
First Examination report received in the corresponding Indian application 202127059439, dated Nov. 8, 2022.

* cited by examiner

METHOD AND APPARATUS FOR DETERMINING STATE OF CHARGE OF BATTERY, MANAGEMENT SYSTEM AND STORAGE MEDIUM

CROSS-REFERENCE TO RELATED APPLICATIONS

The present application is a national stage of International Application No. PCT/CN2020/096438, filed on Jun. 17, 2020, which claims priority to Chinese Patent Application No. 201910548061.4, filed with the China National Intellectual Property Administration on Jun. 24, 2019, and entitled "METHOD AND APPARATUS FOR DETERMINING STATE OF CHARGE OF BATTERY, MANAGEMENT SYSTEM AND STORAGE MEDIUM". The disclosures of the aforementioned applications are incorporated herein by reference in their entireties.

TECHNICAL FIELD

The present disclosure relates to the field of battery technologies, and in particular, to a method and an apparatus for determining a state of charge of a battery, a battery management system and a storage medium.

BACKGROUND

Real-time and accurate estimation of a state of charge (SOC) of a battery plays an important role in implementing battery indication, remaining mileage, overcharge and overdischarge protection, battery balancing, charge control, and battery health prediction, etc., of a battery management system. At present, conventional methods for SOC estimation include an open-circuit voltage method, etc. The open-circuit voltage method can use a corresponding relationship (curve) between an open circuit voltage (OCV) and an SOC to obtain an SOC of a battery in a stable state. A limitation of the current open-circuit voltage method is that the OCV-SOC curve of a cell is not affected by a historical operating condition, that is, the OCV is only related to a current temperature and the SOC, and a relatively accurate SOC is obtained after the battery is static to reach a stable state. The battery may have a hysteresis characteristic, where a charging OCV-SOC curve does not coincide with a discharging OCV-SOC curve, that is, the OCV-SOC curve is affected by the historical operating condition, and a change of the OCV-SOC curve may cause a large error in the open-circuit voltage method, and accuracy of SOC estimation is reduced.

SUMMARY

In view of this, a technical problem to be solved by the present disclosure is to provide a method and an apparatus for determining an SOC of a battery, a battery management system, and a storage medium.

According to an aspect of the present disclosure, a method for determining an SOC of a battery is provided, including: obtaining a current OCV value of a battery and cumulative continuous charging or discharging capacity information of the battery; obtaining SOC credible information based on the current OCV value and the cumulative continuous charging or discharging capacity information; obtaining a corrected SOC value corresponding to the current OCV value according to the SOC credible information.

Optionally, the current OCV value and the cumulative continuous charging or discharging capacity information are obtained if it is determined that the battery is in a static state based on a preset static condition.

Optionally, the SOC credible information includes: a first SOC credible range and a second SOC credible range; where the obtaining SOC credible information based on the current OCV value and the cumulative continuous charging or discharging capacity information includes: obtaining a first SOC credible range based on the current OCV value and a cumulative continuous charging capacity of the battery, or obtaining a second SOC credible range based on the current OCV value and a cumulative continuous discharging capacity of the battery; the obtaining a corrected SOC value corresponding to the current OCV value according to the SOC credible information includes: obtaining a corrected SOC value corresponding to the current OCV value based on the first SOC credible range or the second SOC credible range.

Optionally, the obtaining a corrected SOC value corresponding to the current OCV value based on the first SOC credible range or the second SOC credible range includes: obtaining an initial SOC value corresponding to the current OCV value; determining whether the initial SOC value is within the first SOC credible range or the second SOC credible range; if yes, determining the corrected SOC value to be the initial SOC value, if no, correcting the initial SOC value based on a preset SOC correction strategy and the first SOC credible range or the second SOC credible range to obtain the corrected SOC value.

Optionally, the obtaining an initial SOC value corresponding to the current OCV value includes: obtaining preset first mapping relationship information between an OCV and an SOC; obtaining an initial SOC value corresponding to the current OCV value based on the first mapping relationship information between the OCV and the SOC.

Optionally, the correcting the initial SOC value based on a preset SOC correction strategy and the first SOC credible range or the second SOC credible range includes: taking an SOC upper limit of the first SOC credible range or the second SOC credible range as the corrected SOC value if the initial SOC value is greater than an SOC upper limit of the first SOC credible range or the second SOC credible range; taking an SOC lower limit of the first SOC credible range or the second SOC credible range as the corrected SOC value if the initial SOC value is smaller than an SOC lower limit of the first SOC credible range or the second SOC credible range.

Optionally, the cumulative continuous charging capacity is obtained if the battery is in a charging state before being in a static state, and the first SOC credible range is obtained based on the current OCV value and the cumulative continuous charging capacity; the cumulative continuous discharging capacity is obtained if the battery is in a discharging state before being in a static state, and the second SOC credible range is obtained based on the current OCV value and the cumulative continuous discharging capacity.

Optionally, the cumulative continuous charging capacity and the cumulative continuous discharging capacity are recorded in real time; in a case that a current direction of the battery changes from a charging direction to a discharging direction, the cumulative continuous charging capacity is cleared if it is determined that a duration of a current direction change exceeds a preset first duration threshold or a capacity discharged by the battery exceeds a preset first capacity threshold; in a case that a current direction of the battery changes from a discharging direction to a charging direction, the cumulative continuous discharging capacity is cleared if it is determined that a duration of a current direction change exceeds a preset second duration threshold or a capacity charged to the battery exceeds a preset second capacity threshold.

Optionally, the static condition includes: a static time of the battery reaching or exceeding a preset static time threshold.

Optionally, second mapping relationship information between an OCV and an SOC of the battery, a corresponding relationship between a cumulative continuous charging capacity and an SOC of the battery, and a corresponding relationship between a cumulative continuous discharging capacity and an SOC of the battery are obtained in advance; SOC credible information corresponding to an OCV and a cumulative continuous charging capacity, and SOC credible information corresponding to an OCV and a cumulative continuous discharging capacity are set, respectively, according to the second mapping relationship information between the OCV and the SOC, the corresponding relationship between a cumulative continuous charging capacity and an SOC of the battery, and the corresponding relationship between a cumulative continuous discharging capacity and an SOC of the battery.

According to another aspect of the present disclosure, an apparatus for determining an SOC of a battery is provided, including: a battery information obtaining module, configured to obtain a current OCV value of a battery and cumulative continuous charging or discharging capacity information of the battery; an SOC credible information determining module, configured to obtain SOC credible information based on the current OCV value and the cumulative continuous charging or discharging capacity information; and an SOC correcting module, configured to obtain a corrected SOC value corresponding to the current OCV value according to the SOC credible information.

According to yet another aspect of the present disclosure, an apparatus for determining an SOC of a battery is provided, including: a memory; and a processor coupled to the memory, the processor being configured to perform the method described above based on instructions stored in the memory.

According to still another aspect of the present disclosure, a battery management system is provided, including the apparatus for determining an SOC of a battery described above.

According to still another aspect of the present disclosure, a computer-readable storage medium is provided, the computer-readable storage medium stores computer instructions, and the instructions are executed by a processor as the method described above.

The method and the apparatus for determining an SOC of a battery, the battery management system and the storage medium of the present disclosure obtain the SOC credible information according to the current OCV value of the battery and the cumulative continuous charging or discharging capacity information of the battery, and obtain the corrected SOC value corresponding to the current OCV according to the SOC credible information. By determining the SOC credible information under the current OCV, accuracy of SOC correction could be improved. For batteries, especially those with a hysteresis characteristic, accuracy of SOC estimation could be improved and an error of SOC estimation could be reduced.

BRIEF DESCRIPTION OF DRAWINGS

In order to describe technical solutions in embodiments of the present disclosure or in the prior art more clearly, accompanying drawings needed for describing the embodiments or the prior art will be introduced briefly in the following. Apparently, the accompanying drawings in the following description are merely some embodiments of the present disclosure, and for those of ordinary skill in the art, other drawings may still be obtained according to these accompanying drawings without any creative effort.

DESCRIPTION OF EMBODIMENTS

The present disclosure is described more comprehensively below with reference to the accompanying drawing, in which exemplary embodiments of the present disclosure are explained. Technical solutions in embodiments of the present disclosure will be described clearly and comprehensively in the following with reference to the accompanying drawings in the embodiments of the present disclosure. Apparently, the described embodiments are merely part of the embodiments of the present disclosure, rather than all the embodiments. All other embodiments obtained by those of ordinary skill in the art based on the embodiments of the present disclosure without any creative effort fall within the protection scope of the present disclosure. The technical solutions of the present disclosure are described in several aspects with reference to various accompanying drawings and embodiments in the following.

The "first" and "second" in the following are merely used for distinguishing in the description, and there are no other special meanings.

Figure 1:
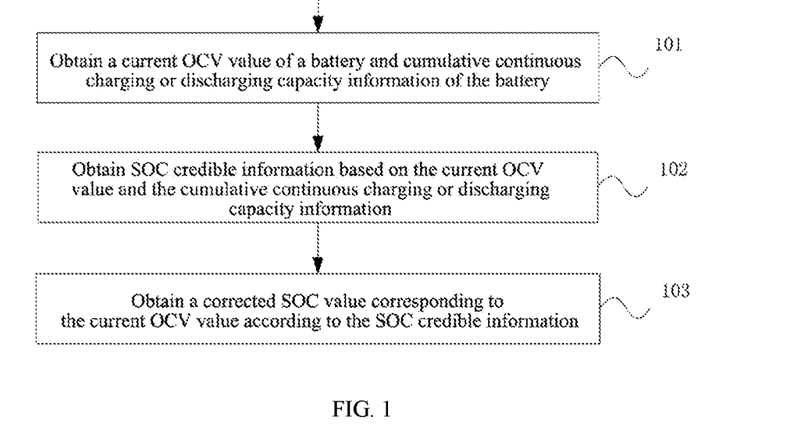
FIG. 1 is a schematic flowchart of an embodiment of a method for determining an SOC of a battery according to the present disclosure.

FIG. 1 is a schematic flowchart of an embodiment of a method for determining an SOC of a battery according to the present disclosure, as shown in FIG. 1:

Step 101: Obtain a current OCV value of a battery and cumulative continuous charging or discharging capacity information of the battery.

In terms of battery type, the battery may be, but not limited to, a lithium iron phosphate system battery or a silicon-added system battery. The lithium iron phosphate system battery is a lithium-ion battery with a positive electrode active material containing lithium iron phosphate, and the silicon-added system battery is a lithium-ion battery with a negative electrode active material containing silicon, etc. In terms of battery scale, the battery may be a single cell, a battery set, a module, a battery pack, etc., with a hysteresis characteristic, which is not specifically limited in the embodiments of the present disclosure.

Step 102: Obtain SOC credible information based on the current OCV value and the cumulative continuous charging or discharging capacity information. The SOC credible information may have various types of information. For example, the SOC credible information may be an SOC credible range, and the SOC credible range includes an SOC upper limit and an SOC lower limit.

Step 103: Obtain a corrected SOC value corresponding to the current OCV value according to the SOC credible information.

If it is determined that the battery is in a static state based on a present static condition, the current OCV value and the cumulative continuous charging or discharging capacity information are obtained. There may be various types of static conditions. For example, a static condition includes: a static time of the battery reaches or exceeds a preset static time threshold, etc. Satisfying the static condition means that the battery is sufficiently static, and the static time threshold may be determined according to an SOC, a temperature, and a charging or discharging operating condition before being static.

In an embodiment, the SOC credible information includes: a first SOC credible range and a second SOC credible range. The first SOC credible range is obtained based on the current OCV value and a cumulative continuous charging capacity of the battery, or the second SOC credible range is obtained based on the current OCV value and a cumulative continuous discharging capacity of the battery. The corrected SOC value corresponding to the current OCV value is obtained based on the first SOC credible range or the second SOC credible range.

The cumulative continuous charging capacity and the cumulative continuous discharging capacity are recorded in real time. The cumulative continuous charging capacity is an amount of electricity continuously charged when a current direction of the battery maintains a charging direction, and the cumulative continuous discharging capacity is an amount of electricity continuously discharged when the current direction of the battery maintains a discharging direction.

In a case that the current direction of the battery changes from the charging direction to the discharging direction, the cumulative continuous charging capacity is cleared if it is determined that a duration of a current direction change exceeds a preset first duration threshold or a capacity discharged by the battery exceeds a preset first capacity threshold. In a case that the current direction of the battery changes from the discharging direction to the charging direction, the cumulative continuous discharging capacity is cleared if it is determined that a duration of a current direction change exceeds a preset second duration threshold or a capacity charged to the battery exceeds a preset second capacity threshold. The first and second duration thresholds and the first and second capacity thresholds may be set based on test data, etc.

In an embodiment, if the battery is in a charging state before being in the static state, the cumulative continuous charging capacity is obtained, and the first SOC credible range is obtained based on the current OCV value and the cumulative continuous charging capacity; if the battery is in a discharging state before being in the static state, the cumulative continuous discharging capacity is obtained, and the second SOC credible range is obtained based on the current OCV value and the cumulative continuous discharging capacity.

Figure 2:
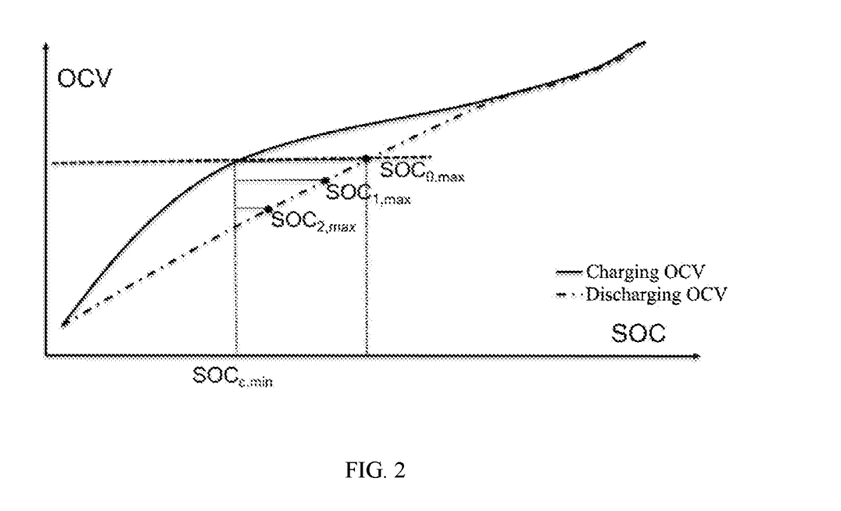
FIG. 2 is a schematic diagram of determining a first SOC credible range when a battery is in a charging state before being in a static state in an embodiment of a method for determining an SOC of a battery according to the present disclosure.

As shown in FIG. 2, a horizontal dotted line in FIG. 2 indicates the current OCV of the battery after being sufficiently static, and a value of c in $SOC_{c,min}$ may be 0, 1, 2, etc. In a case that the battery is in a charging state before being static, if the cumulative continuous charging capacity of the battery before being static is X0, the first SOC credible range is $[SOC_{0,min}, SOC_{0,max}]$; if the cumulative continuous charging capacity of the battery before being static is X1, the first SOC credible range is $[SOC_{1,min}, SOC_{1,max}]$; if the cumulative continuous charging capacity of the battery before being static is X2, the first SOC credible range is $[SOC_{2,min}, SOC_{2,max}]$ . . . and so on, a corresponding first SOC credible range may be obtained based on the cumulative continuous charging capacity of the battery.

Figure 3:
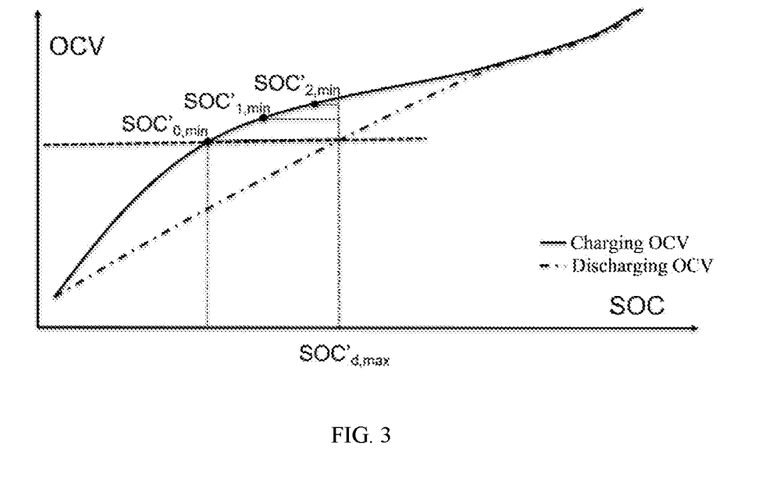
FIG. 3 is a schematic diagram of determining a second SOC credible range when a battery is in a discharging state before being in a static state in an embodiment of a method for determining an SOC of a battery according to the present disclosure.

As shown in FIG. 3, a horizontal dotted line in FIG. 3 indicates the current OCV of the battery after being sufficiently static, and a value of d in $SOC'_{d,min}$ may be 0, 1, 2, etc. In a case that the battery is in a discharging state before being static, if the cumulative continuous discharging capacity of the battery before being static is X0, the second SOC credible range is $[SOC'_{0,min}, SOC'_{0,max}]$; if the cumulative continuous discharging capacity of the battery before being static is X1, the second SOC credible range is $[SOC'_{1,min}, SOC'_{1,max}]$; if the cumulative continuous discharging capacity of the battery before being static is X2, the second SOC credible range is $[SOC'_{2,min}, SOC'_{2,max}]$ . . . and so on, a corresponding second SOC credible range may be obtained based on the cumulative continuous discharging capacity of the battery.

In an embodiment, second mapping relationship information between an OCV and an SOC of the battery, a corresponding relationship between a cumulative continuous charging capacity of the battery and the SOC of the battery, and a corresponding relationship between a cumulative continuous discharging capacity of the battery and the SOC of the battery are obtained in advance. The second mapping relationship information between the OCV and the SOC of the battery may be of various types. For example, the second mapping relationship information includes a charging OCV-SOC curve, a discharging OCV-SOC curve, etc. The corresponding relationship between the cumulative continuous charging capacity of the battery and the SOC of the battery, and the corresponding relationship between the cumulative continuous discharging capacity of the battery and the SOC of the battery may be obtained by using various test equipment and test methods.

SOC credible information corresponding to the OCV and the cumulative continuous charging power, and SOC credible information corresponding to the OCV and the cumulative continuous discharging capacity are set, respectively, according to the second mapping relationship information between the OCV and the SOC, the corresponding relationship between a cumulative continuous charging capacity and an SOC of the battery, and the corresponding relationship between a cumulative continuous discharging capacity and an SOC of the battery.

A battery with a hysteresis characteristic usually has following properties: when a continuous charging capacity reaches a third capacity threshold, a mapping relationship (curve) between the OCV and the SOC coincides with the charging OCV-SOC curve; when a continuous discharging capacity reaches a fourth capacity threshold, the mapping relationship (curve) between the OCV and the SOC coincides with the discharging OCV-SOC curve. When the continuous charging or discharging capacity does not reach the above-mentioned third or fourth capacity threshold, the OCV-SOC curve is between the charging OCV-SOC and the discharging OCV-SOC curve. Therefore, an SOC credible range may be shortened according to a current cumulative continuous charging or discharging capacity, and an SOC credible range under a cumulative continuous charging or discharging capacity may be calibrated under conditions of different current OCVs.

For example, if the OCV of the battery is in a range of [3.4V, 3.6V] and the cumulative continuous charging capacity>=5 Ah, the OCV-SOC curve coincides with the charging OCV-SOC curve. If the battery is in a charging operating condition before being static, and the current OCV of the battery is 3.5V, then:

When the cumulative continuous charging capacity=0 Ah, in a condition that a continuous charging operating condition is unknown, a current OCV-SOC curve may be between the charging OCV-SOC curve and the discharging OCV-SOC curve, and then the first SOC credible range is [S1, S2], where S1 is an SOC that corresponds to the current OCV and that is obtained by querying the charging OCV-SOC curve according to the current OCV, and S2 is an SOC that corresponds to the current OCV and that is obtained by querying the discharging OCV-SOC curve according to the current OCV.

When the cumulative continuous charging capacity=1 Ah, no matter what the operating condition is before continuous charging, a current OCV-SOC curve may have a certain deviation from the discharging OCV-SOC curve, that is, a current SOC may be smaller than S2, and then the first SOC credible range is [S1, S2'], where S2' is determined according to a calibration apparatus and a special test procedure, and S2'<S2.

When the cumulative continuous charging capacity=2 Ah, no matter what the operating condition is before continuous charging, a current OCV-SOC curve may have a greater deviation from the discharging OCV-SOC curve, that is, a current SOC may be smaller than S2, and then the first SOC credible range is [S1, S2"], where S2" is determined according to a calibration apparatus and a special test procedure, and S2"<S2'<S2.

When the cumulative continuous charging capacity>=5 Ah, no matter what the operating condition is before continuous charging, a current OCV-SOC curve may have a maximum deviation from the discharging OCV-SOC curve, and coincides with the charging OCV-SOC curve, that is, the first SOC credible range is [S1, S1].

By collating the above results, a corresponding relationship table or a fitting function relationship between the cumulative continuous charging capacity and the SOC upper limit and lower limit of the first SOC credible range under the condition of the current OCV=3.5V may be obtained. By analogy, corresponding relationship tables or fitting function relationships between the cumulative continuous charging capacity and the SOC upper limit and lower limit of the first SOC credible range for all current OCVs of the battery may be obtained. Based on the same method, corresponding relationship tables or fitting function relationships between the cumulative current continuous discharging capacity and the SOC upper limit and lower limit of the second SOC credible range for all current OCVs of the battery may be obtained.

Figure 4:
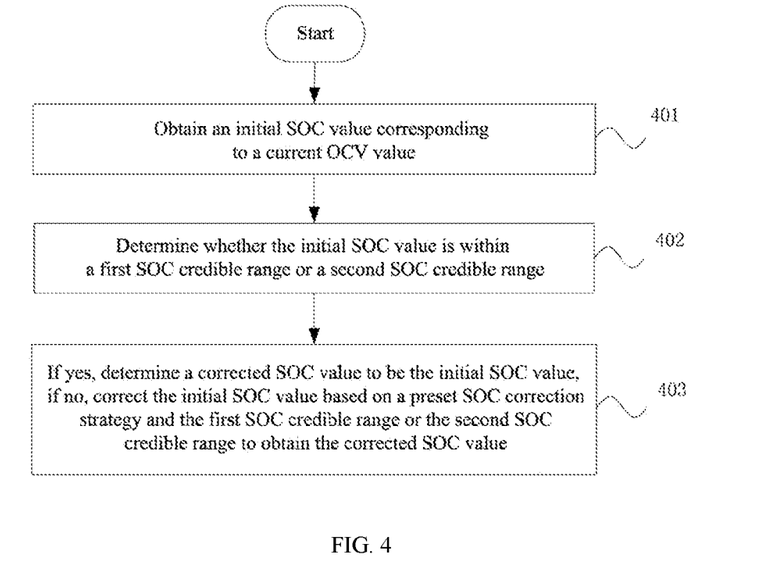
FIG. 4 is a schematic flowchart of obtaining a corrected SOC value in an embodiment of a method for determining an SOC of a batter according to the present disclosure.

FIG. 4 is a schematic flowchart of obtaining a corrected SOC value in an embodiment of a method for determining an SOC of a battery according to the present disclosure, as shown in FIG. 4:

Step 401: Obtain an initial SOC value corresponding to a current OCV value.

Step 402: Determine whether the initial SOC value is within a first SOC credible range or a second SOC credible range.

Step 403: If yes, determine a corrected SOC value to be the initial SOC value, if no, correct the initial SOC value based on a preset SOC correction strategy and the first SOC credible range or the second SOC credible range to obtain the corrected SOC value.

There may be various methods to obtain the initial SOC value corresponding to the current OCV value. For example, preset first mapping relationship information between an OCV and an SOC is obtained, and the first OCV and SOC mapping relationship information may be a current OCV-SOC mapping relationship table, etc. For example, first OCV-SOC mapping relationship information is an OCV-SOC mapping relationship table currently stored in a vehicle, etc. The initial SOC value corresponding to the current OCV value is obtained based on the first mapping relationship information between the OCV and the SOC.

The initial SOC value is corrected based on the preset SOC correction strategy and the first SOC credible range or the second SOC credible range and there may be various preset SOC correction strategies. For example, if the initial SOC value is greater than an SOC upper limit of the first SOC credible range or the second SOC credible range, the SOC upper limit of the first SOC credible range or the second SOC credible range is taken as the corrected SOC value; if the initial SOC value is smaller than an SOC lower limit of the first SOC credible range or the second SOC credible range, the SOC lower limit of the first SOC credible range or the second SOC credible range is taken as the corrected SOC value.

For example, when the current OCV of the battery is 3.5V, a comparison table of the cumulative continuous charging capacity and the first SOC credible range is as shown in Table 1 below:

When the current OCV of the battery is 3.5V:

TABLE 1

Comparison table of the cumulative continuous charging capacity and the first SOC credible range

| Cumulative continuous charging capacity | X1 | X2 | . . . | XN |
|---|---|---|---|---|
| SOC credible upper limit (OCV = 3.5 V) | D1 | D2 | . . . | DN |
| SOC credible lower limit (OCV = 3.5 V) | E1 | E2 | . . . | EN |

In Table 1, X1, X2, . . . , XN represent cumulative continuous charging capacities, D1, D2, . . . , DN represent possible true SOC upper limits under the cumulative continuous charging capacities, E1, E2, . . . , EN represent possible true SOC upper limits under the cumulative continuous charging capacities. D1, D2, . . . , DN and E1, E2, . . . , EN may be obtained through related tests, experiments, etc. For different current OCV values of the battery, corresponding comparison tables of the cumulative continuous charging capacity and the first SOC credible range as shown in Table 1 or corresponding comparison tables of the cumulative continuous discharging capacity and the second SOC credible range are set, with content of each table being as shown in Table 1.

For example, when the battery is in a charging state before being in a static state, and the cumulative continuous charging capacity is X=2 Ah, Table 1 is looked up, and the SOC upper limit Dx=30% and lower limit Ex=25% are obtained by looking up Table 1 according to the cumulative continuous charging capacity X=2 Ah. If the current estimated SOC is greater than the SOC upper limit, the current SOC is corrected to Dx, and if the current estimated SOC is smaller than the SOC lower limit, the current SOC is corrected to Ex.

Figure 5:
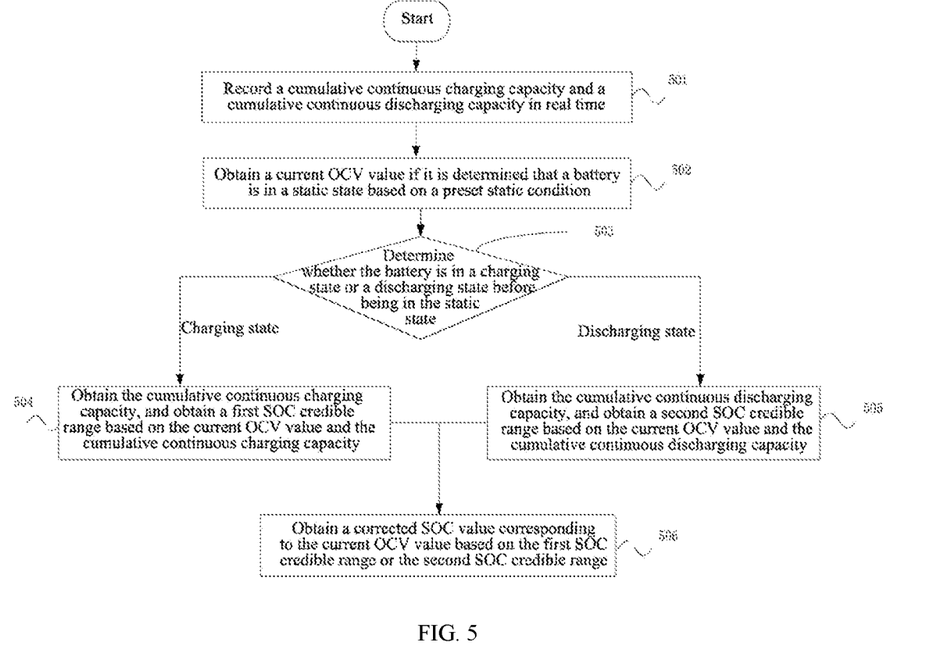
FIG. 5 is a schematic flowchart of another embodiment of a method for determining an SOC of a battery according to the present disclosure.

FIG. 5 is a schematic flowchart of another embodiment of a method for determining an SOC of a battery according to the present disclosure, as shown in FIG. 5:

Step 501: Record a cumulative continuous charging capacity and a cumulative continuous discharging capacity in real time.

Step 502: Obtain a current OCV value if it is determined that a battery is in a static state based on a preset static condition.

Step 503: Determine whether the battery is in a charging state or a discharging state before being in the static state, proceed to Step 504 if in the charging state, and proceed to Step 505 if in the discharging state.

Step 504: Obtain the cumulative continuous charging capacity, and obtain a first SOC credible range based on the current OCV value and the cumulative continuous charging capacity.

Step 505: Obtain the cumulative continuous discharging capacity, and obtain a second SOC credible range based on the current OCV value and the cumulative continuous discharging capacity.

Step 506: Obtain a corrected SOC value corresponding to the current OCV value based on the first SOC credible range or the second SOC credible range.

For example, when a battery is in a charging state before being in a static state, a first SOC credible range [Ex, Dx] is obtained according to a current OCV and a cumulative continuous charging capacity Cc of the battery. When a battery is in a discharging state before being in a static state, a second SOC credible range [Fx, Gx] is obtained according to a current OCV and a cumulative continuous discharging capacity Cd of the battery.

A table or a fitting function relationship, etc., may be obtained in advance by calibration through a specific test procedure, and the first SOC credible range [Ex, Dx] and the second SOC credible range [Fx, Gx] may be obtained based on the table or fitting function relationship, etc., and according to the current OCV, the cumulative continuous charging capacity Cc and the cumulative continuous discharging capacity Cd. The first SOC credible range [Ex, Dx] and the second SOC credible range [Fx, Gx] may also be obtained through a fitting function relationship between variables (taking an OCV and a cumulative continuous charging capacity as inputs, and taking SOC credible upper and lower limits as outputs), for example, obtained by methods, such as polynomial fitting, neural network, etc.

A current estimated initial SOC is corrected according to a current first SOC credible range [Ex, Dx]: if the current initial SOC is greater than the upper limit Dx of the SOC credible range, the initial SOC is corrected to Dx, if the initial SOC is smaller than the lower limit Ex of the SOC credible range, the initial SOC is corrected to Ex. If the initial SOC is within the range of [Ex, Dx], no correction is made.

Figure 6:
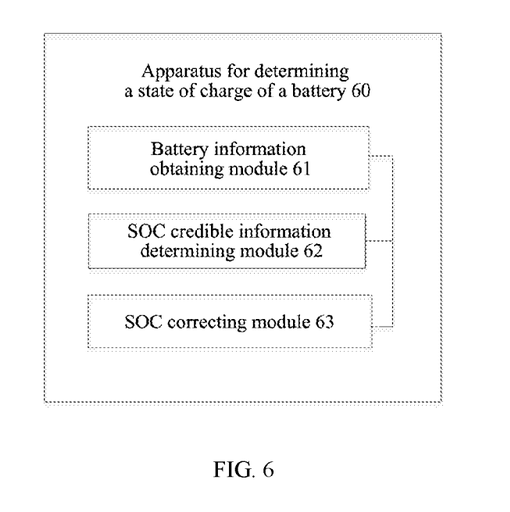
FIG. 6 is a schematic modular diagram of an embodiment of an apparatus for determining an SOC of a battery according to the present disclosure.

In an embodiment, as shown in FIG. 6, the present disclosure provides an apparatus 60 for determining an SOC of a battery, including: a battery information obtaining module 61, an SOC credible information determining module 62, and an SOC correcting module 63. The battery information obtaining module 61 obtains a current OCV value of a battery and cumulative continuous charging or discharging capacity information of the battery. The SOC credible information determining module 62 obtains SOC credible information based on the current OCV value and the cumulative continuous charging or discharging capacity information. The SOC correcting module 63 obtains a corrected SOC value corresponding to the current OCV value according to the SOC credible information.

If it is determined that the battery is in a static state based on a preset static condition, the battery information obtaining module 61 obtains the current OCV value and the cumulative continuous charging or discharging capacity information. The static condition includes: a static time of the battery reaches or exceeds a preset static time threshold, etc.

The SOC credible information includes: a first SOC credible range and a second SOC credible range. The SOC credible information determining module 62 obtains the first SOC credible range based on the current OCV value and a cumulative continuous charging capacity of the battery, or obtains the second SOC credible range based on the current OCV value and a cumulative continuous discharging capacity of the battery. The SOC correcting module 63 obtains the corrected SOC value corresponding to the current OCV value based on the first SOC credible range or the second SOC credible range.

Figure 7:
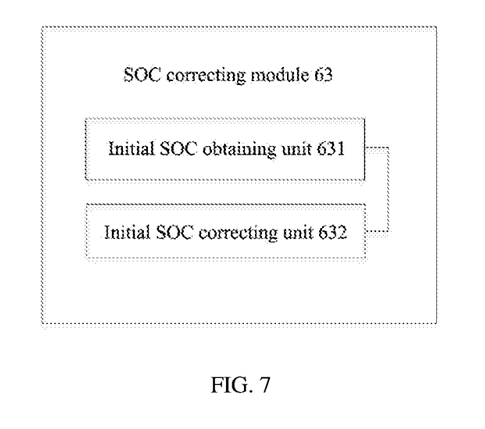
FIG. 7 is a schematic modular diagram of an SOC correcting module in an embodiment of an apparatus for determining an SOC of a battery according to the present disclosure.

In an embodiment, as shown in FIG. 7, the SOC correcting module 63 includes: an initial SOC obtaining unit 631 and an initial SOC correcting unit 632. The initial SOC obtaining unit 631 obtains an initial SOC value corresponding to the current OCV value. The initial SOC obtaining unit 631 obtains preset first mapping relationship information between an OCV and an SOC, and obtains the initial SOC value corresponding to the current OCV value based on the first mapping relationship information between the OCV and the SOC.

The initial SOC correcting unit 632 determines whether the initial SOC value is within the first SOC credible range or the second SOC credible range. If yes, the initial SOC correcting unit 632 determines the corrected SOC value to be the initial SOC value, if no, the initial SOC correcting unit 632 corrects the initial SOC value based on a preset SOC correction strategy and the first SOC credible range or the second SOC credible range to obtain the corrected SOC value.

If the initial SOC value is greater than an SOC upper limit of the first SOC credible range or the second SOC credible range, the initial SOC correcting unit 632 takes the SOC upper limit of the first SOC credible range or the second SOC credible range as the corrected SOC value; if the initial SOC value is smaller than an SOC lower limit of the first SOC credible range or the second SOC credible range, the initial SOC correcting unit 632 takes the SOC lower limit of the first SOC credible range or the second SOC credible range as the corrected SOC value.

In an embodiment, if the battery is in a charging state before being in the static state, the battery information obtaining module 61 obtains the cumulative continuous charging capacity. The SOC credible information determining module 62 obtains the first SOC credible range based on the current OCV value and the cumulative continuous charging capacity. If the battery is in a discharging state before being in the static state, the battery information obtaining module 61 obtains the cumulative continuous discharging capacity. The SOC credible information determining module 62 obtains the second SOC credible range based on the current OCV value and the cumulative continuous discharging capacity.

Figure 8:
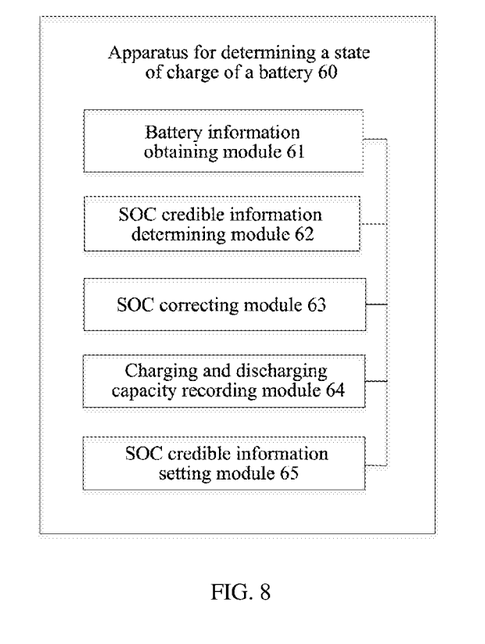
FIG. 8 is a schematic modular diagram of another embodiment of an apparatus for determining an SOC of a battery according to the present disclosure.

As shown in FIG. 8, the apparatus 60 for determining an SOC of a battery includes: a charging and discharging capacity recording module 64. The charging and discharging capacity recording module 64 records the cumulative continuous charging capacity and the cumulative continuous discharging capacity in real time. In a case that a current direction of the battery changes from a charging direction to a discharging direction, the charging and discharging capacity recording module 64 clears the cumulative continuous charging capacity to zero if it is determined that a duration of a current direction change exceeds a preset first duration threshold or a capacity discharged by the battery exceeds a preset first capacity threshold. In a case that the current direction of the battery changes from the discharging direction to the charging direction, the charging and discharging capacity recording module 64 clears the cumulative continuous discharging capacity to zero if it is determined that a duration of a current direction change exceeds a preset second duration threshold or a capacity charged to the battery exceeds a preset second capacity threshold.

As shown in FIG. 8, the apparatus 60 for determining an SOC of a battery includes: an SOC credible information setting module 65. The SOC credible information setting module 65 obtains second mapping relationship information between an OCV and an SOC of the battery, a corresponding relationship between the cumulative continuous charging capacity of the battery and the SOC of the battery, and a corresponding relationship between the cumulative continuous discharging capacity of the battery and the SOC of the battery in advance. The SOC credible information setting module 65 sets SOC credible information corresponding to the OCV and the cumulative continuous charging power, and the SOC credible information corresponding to the OCV and the cumulative continuous discharging capacity, respectively, according to the second mapping relationship information between the OCV and the SOC, the corresponding relationship between a cumulative continuous charging capacity and an SOC of the battery, and the corresponding relationship between a cumulative continuous discharging capacity and an SOC of the battery.

Figure 9:
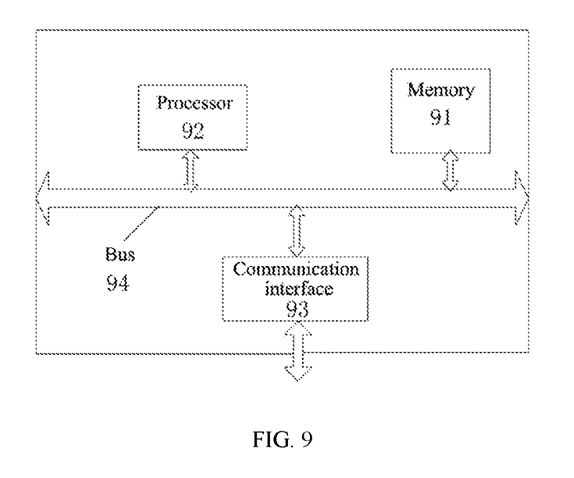
FIG. 9 is a schematic modular diagram of yet another embodiment of an apparatus for determining an SOC of a battery according to the present disclosure.

FIG. 9 is a schematic modular diagram of another embodiment of an apparatus for determining an SOC of a battery according to the present disclosure. As shown in FIG. 9, the apparatus may include a memory 91, a processor 92, a communication interface 93 and a bus 94. The memory 91 is configured to store instructions, and the processor 92 is coupled to the memory 91. The processor 92 is configured to execute the above method for determining an SOC of a battery based on the instructions stored in the memory 91.

The memory 91 may be a high-speed random-access memory (RAM) memory, a non-volatile memory, etc. The memory 91 may also be a memory array. The storage 91 may also be divided into blocks, and the blocks may be combined into a virtual volume according to a certain rule. The processor 92 may be a central processing unit (CPU), or an application specific integrated circuit (ASIC), or one or more integrated circuits configured to implement the method for determining an SOC of a battery of the present disclosure.

In an embodiment, the present disclosure provides a battery management system, including the apparatus for determining an SOC of a battery in any of the above embodiments. The battery management system may be installed on a vehicle, etc., to manage the battery.

In an embodiment, the present disclosure provides a computer-readable storage medium, and the computer-readable storage medium stores computer instructions, and the method for determining an SOC of a battery in any of the above embodiments is implemented when the instructions are executed by a processor.

The method and the apparatus for determining an SOC of a battery, the battery management system, and the storage medium in the above embodiments obtain the SOC credible information according to the current OCV value of the battery and the cumulative continuous charging or discharging capacity information of the battery, and obtain the corrected SOC value corresponding to the current OCV value according to the SOC credible information. By determining the SOC credible information under the current OCV, the upper and lower limits of SOC could be reduced, and accuracy of SOC correction could be improved. For batteries, especially those with a hysteresis characteristic, accuracy of SOC estimation could be improved and an error of SOC estimation could be reduced. Reliability of battery and experience of users could be improved.

The method and the system of the present disclosure may be implemented in many ways. For example, the method and the system of the present disclosure may be implemented by software, hardware, firmware, or any combination of software, hardware and firmware. The above order for the steps of the method is merely for illustration, and the steps of the method of the present disclosure are not limited to the order specifically described above unless otherwise specifically stated. Furthermore, in some embodiments, the present disclosure may also be implemented as programs recorded in a recording medium, and these programs include computer-readable instructions for implementing the method according to the present disclosure. Therefore, the present disclosure also covers the recording medium storing a program for executing the method according to the present disclosure.

The description of the present disclosure has been presented for the purpose of illustration and description, and is not exhaustive or limiting the present disclosure to the disclosed form. Many modifications and changes may be apparent to those of ordinary skill in the art. The embodiments are selected and described in order to better explain the principles and practical applications of the present disclosure, and to enable those of ordinary skill in the art to understand the present disclosure to design various embodiments with various modifications suitable for specific applications.

The invention claimed is:

1. A method for determining a state of charge of a battery, comprising:
    obtaining a current OCV value of a battery;
    obtaining cumulative continuous charging capacity information of the battery;
    obtaining SOC credible information based on the current OCV value and the cumulative continuous charging capacity information, the SOC credible information includes an SOC upper limit and an SOC lower limit;
    obtaining an initial SOC value corresponding to the current OCV value;

correcting the initial SOC value to the SOC upper limit if the initial SOC value is greater than the SOC upper limit.

2. The method according to claim 1, wherein the obtaining a current OCV value of a battery comprises:
    obtaining the current OCV value of the battery if it is determined that the battery is in a static state based on a preset static condition;
    wherein the preset static condition comprises:
    a static time of the battery reaching or exceeding a preset static time threshold.

3. The method according to claim 2, wherein the obtaining cumulative continuous charging capacity information of the battery, comprises:
    obtaining the cumulative continuous charging capacity if the battery is in a charging state before being in the static state.

4. The method according to claim 3, further comprising:
    recording the cumulative continuous charging capacity of the battery.

5. The method according to claim 4, further comprising:
    in a case that a current direction of the battery changes from a charging direction to a discharging direction, clearing the cumulative continuous charging capacity if it is determined that a duration of a current direction change exceeds a preset first duration threshold or a capacity discharged by the battery exceeds a preset first capacity threshold.

6. The method according to claim 1, wherein the obtaining an initial SOC value corresponding to the current OCV value comprises:
    obtaining preset first mapping relationship information between an OCV and an SOC; and
    obtaining the initial SOC value corresponding to the current OCV value based on the first mapping relationship information between the OCV and the SOC.

7. An apparatus for determining a state of charge of a battery, comprising:
    a battery information obtaining module, configured to obtain a current OCV value of a battery and cumulative continuous charging capacity information of the battery;
    an SOC credible information determining module, configured to obtain SOC credible information based on the current OCV value and the cumulative continuous charging capacity information, the SOC credible information includes an SOC upper limit and an SOC lower limit; and
    an SOC correcting module, configured to obtain a corrected SOC value corresponding to the current OCV value; and
    correct the initial SOC value to the SOC upper limit if the initial SOC value is greater than the SOC upper limit.

8. The apparatus according to claim 7, wherein the SOC correcting module is further configured to
    correct the initial SOC value to the SOC lower limit if the initial SOC value is smaller than the SOC lower limit.

9. The apparatus according to claim 7, wherein the battery information obtaining module is configured to
    obtain the current OCV value of the battery if it is determined that the battery is in a static state based on a preset static condition,
    wherein the preset static condition comprises: a static time of the battery reaching or exceeding a preset static time threshold.

10. The apparatus according to claim 9, wherein the battery information obtaining module is configured to
    obtain the cumulative continuous charging capacity if the battery is in a charging state before being in the static state.

11. The apparatus according to claim 10, further comprising:
    a charging and discharging capacity recording module, configured to record the cumulative continuous charging capacity of the battery.

12. The apparatus according to claim 11, wherein
    in a case that a current direction of the battery changes from a charging direction to a discharging direction, the charging and discharging capacity recording module is further configured to clear the cumulative continuous charging capacity if it is determined that a duration of a current direction change exceeds a preset first duration threshold or a capacity discharged by the battery exceeds a preset first capacity threshold.

13. The apparatus according to claim 7, wherein the SOC correcting module is further configured to
    obtain preset first mapping relationship information between an OCV and an SOC; and
    obtain the initial SOC value corresponding to the current OCV value based on the first mapping relationship information between the OCV and the SOC.

14. A battery management system, comprising:
    the apparatus for determining a SOC of a battery according to claim 7.

* * * * *